(12) United States Patent
Kallina

(10) Patent No.: US 6,313,800 B1
(45) Date of Patent: Nov. 6, 2001

(54) ADJUSTABLE BROADBAND ANTENNA

(76) Inventor: Henry D. Kallina, 5693 E. Valley High Dr., Parker, CO (US) 80134

( * ) Notice: Subject to any disclaimer, the term of this patent is extended or adjusted under 35 U.S.C. 154(b) by 0 days.

(21) Appl. No.: 09/467,639

(22) Filed: Dec. 20, 1999

Related U.S. Application Data

(63) Continuation of application No. 09/001,697, filed on Dec. 31, 1997, now Pat. No. 6,005,518.

(51) Int. Cl.[7] ....................................... H01Q 1/32
(52) U.S. Cl. ........................... 343/715; 343/821; 343/831
(58) Field of Search .................... 343/713, 711, 343/830, 831, 715, 826, 825, 900, 821, 811

(56) References Cited

U.S. PATENT DOCUMENTS 4,238,799 * 12/1980 Parfitt ................................. 343/715
4,658,259 * 4/1987 Blaese ................................. 343/715

FOREIGN PATENT DOCUMENTS

55008145-A 1/1980 (JP).
59183502-A 10/1984 (JP).
11068438-A 3/1999 (JP).

* cited by examiner

*Primary Examiner*—Don Wong
*Assistant Examiner*—Ephrem Alemu
(74) *Attorney, Agent, or Firm*—Ramon L. Pizarro; Edwin H.Crabtree

(57) ABSTRACT

An adjustable antenna for receiving broadband signals. The antenna includes a first elongated antenna rod that is held next to a second elongated antenna rod in a parallel orientation to the first elongated antenna rod. The antenna rods are supported by a clamping or supporting device that allows the two rods to be slid relative to one another so that the antenna may be tuned to a particular frequency. Electrical contacts to the rods are also provided to allow transmission of the collected signal to a desired device.

3 Claims, 11 Drawing Sheets

ADJUSTABLE BROADBAND ANTENNA

REFERENCE TO RELATED APPLICATIONS

This application is a continuation of my application having Ser. No. 09/001,697, filed Dec. 31, 1997, now U.S. Pat. No. 6,005,518, which is incorporated herein in its entirety by reference.

FIELD OF THE INVENTION

This invention relates to an adjustable antenna for detecting broadband frequency signals. More particularly, but not by way of limitation, to a wavelength tuneable antenna which includes a pair of spaced apart parallel rods.

BACKGROUND OF THE INVENTION

A continuing problem in high frequency communications networks, both in their installation and maintenance, is the necessity of assuring the integrity of the transmission line. This is particularly true in cable television systems where RF leaks in the CATV coaxial cable distribution networks can severely effect the quality of the received signal. Such leaks may be due to small cracks in the cable, loose fittings or other non-RF tight conditions.

The FCC requires that cable TV/LAN operators monitor their networks and calculate a Cumulative Leakage Index (CLI). The components of the CLI are the RF signal level, the distance from the coaxial cable, the frequency of the signal, and the number of leaks per coax mile. The CLI is calculated for a specific time period.

There are several licensed sources of RF energy in the frequency range that is used by the CATV industry for video. There are also unintended sources of RF energy in this frequency range such as power grids and commercial microwave ovens.

In the process of measuring the CLI it is essential to include signals which are true leaks from the CATV system. It is equally important to exclude those signals which are not leakage from the CATV system.

Previous efforts to solve this and related problems are covered in the following patents.

U.S. Pat. No. 5,294,937 (1994) to Osteen et al. discloses a cable leakage detection system to be placed in a moving vehicle. The system comprises a computer control and storage unit connected to a GPS Receiver, an RF meter and a hand held keypad. This device measures cable leakages and stores the data with time and location information on a floppy disk.

U.S. Pat. No. 4,413,229 (1983) to Grant discloses a method and apparatus for remote indication of faults in cable systems using an RF signal for fault detection.

U.S. Pat. No. 4,810,961 (1989) to Takahaski et al. discloses a system to determine the RF leakage from an electromagnetically shielded building. The system consists of transmitters with a different frequency for each floor of the building.

U.S. Pat. No. 4,072,899 (1978) to Shimp discloses an RF leak detector for detecting leakages from CATV coaxial cable lines. The RF leaks are detected by transmitting a unique signal and using a narrow band Receiver to detect the unique signal to thereby detect small amounts of RF leakages from defective CATV coaxial cables. If there is a leak, a unique recognizable audible tone will be detected.

U.S. Pat. No. 4,100,572 (1978) to Cochrane discloses a method and apparatus to test transmission lines using pulses of one nano-second duration.

A method used in the past to calculate the CLI is to use an RF detector and measure the field strength of signals in the frequency range of interest. However, because of the proliferation of RF generating equipment, such as two-way radios, florescent lights, and the like, erroneous detections of RF leaks are often made.

Another prior art method to detect leaks in the CATV system which eliminates the possibility of detecting erroneous signals is to transmit a unique signal on the CATV system. A narrow band Receiver is used to detect the unique signal. This method can be used to identify leaks from the CATV system in the presence of erroneous signals in the same frequency range. The disadvantage of this method is that it requires the transmission of the test signal over the CATV system. The spectrum available on the CATV system is increasingly limited, hindering the use of this method.

There is a need for a device that can positively identify an RF signal in the range of interest as a leak.

The present invention will detect and positively identify an RF signal as a leak from the CATV system. Further, the present invention will ignore RF signals that are not CATV leaks in the calculation of the CLI.

The present invention is an RF Receiver which can be mounted in a vehicle. The RF Receiver can be implemented with several options depending on the purpose of the vehicle (i.e. monitoring system health integrity or repair of defective components). The RF Receiver is a passive unit that requires no special test signals on the CATV system. The RF Receiver does not limit the speed of the vehicle.

An option of the invention used to aid in the location of the leak is an ability to determine if the leak is on the left or right side of the vehicle.

SUMMARY OF THE INVENTION

The main object of the present invention is to provide an RF leakage detector for the CATV industry which will unambiguously detect a leak in a cable system.

Another object of the present invention is to provide a computerized calculation of the Cumulative Leakage Index (CLI) or the Vehicular Leakage Index (VLI).

Another object of the present invention is to provide a video detection signal functioning to positively identify a signal as a leak from the CATV system.

Another object of the present invention is to provide data display of the video signal showing an unambiguous video signature.

Another object of the present invention is to detect if the leak is on the left or right side of the vehicle which is carrying the RF detector.

Another object of the present invention is to provide data storage of the RF level of the detected leaks, the time, date, and location of the leaks, the distance to the coax cable, the RF frequency of the leak, the valid signal detect, and the right/left location of the leak.

Other objects of this invention will appear from the following description and appended claims, reference being had to the accompanying drawings forming a part of this specification wherein like reference characters designate corresponding parts in the several views.

The preferred embodiment of the invention will have an RF Receiver, a microprocessor, a Global Positioning System Receiver, a deluxe control head, and an antenna capable of detecting the direction to the leak.

The RF Receiver has the ability to tune to a TV channel which is being transmitted by the CATV system. The RF Receiver has within it both an AM Receiver and an FM Receiver. The RF Receiver can be set to detect a signal of a preset signal strength corresponding to the distance of the vehicle from the cable. The RF Receiver can receive the AM and the FM components of the tuned television channel. The RF Receiver has the ability to correctly identify the "signature" of a video signal which is leaking from the CATV system by using the AM Receiver to detect the 15.734 Khz horizontal sync. If there is no horizontal sync, the signal is not video and will be ignored. If the sync is present, the signal may be video and an LED will light on the front panel indicating that the horizontal sync is present. The device can further identify the leakage signal as video by monitoring the 59.94 Hz vertical sync from the AM Receiver with a speaker. An alternative method of identifying the signal as the desired television channel (controlled by a front panel switch) is to monitor the FM audio sound of the tuned television signal on the speaker. The output of the FM Receiver will be displayed on the light emitting diode display meter.

The RF leakage detector can also be used to detect signals other than television signals (i.e. carriers and the like). Because the RF Receiver has within it an AM FM, and FSK Receiver the modulation of the signals can be detected. The detected results can be displayed on the deluxe control head or stored by the microprocessor. The audio speaker and the microprocessor can be used to validate the signal.

The signal level of the video and the signal level of the sync will be displayed simultaneously on the meter. The final indication that the signal is a video leak of the tuned television channel will be a 3 dB to 6 dB difference between the peak sync signal and the average video signal.

The microprocessor is used to collect data, process it, and store the data in a memory device. The microprocessor has ports to be used to download the collected data. The microprocessor is interfaced with the Receiver and can be further interfaced with the speedometer cable of the vehicle and or the Global Positioning System (GPS) Receiver.

The microprocessor is used to calculate the Cumulative Leakage Index (CLI) or the Vehicular Leakage Index (VLI). The components of the CLI are the RF signal level, the distance from the coaxial cable, the frequency of the signal, and the number of leaks per coax mile. The CLI is calculated for a specific time period. The CLI is calculated at three meters.

The present invention can calculate the CLI by placing the vehicle at three meters from the leak. However, in use, the present invention can also calculate a vehicular leakage index (VLI).

The VLI is the same as the CLI with the average distance from the antenna to the cable input by the operator. The VLI can indicate the signal strength of the signal at the vehicle. The VLI can also indicate the signal strength that would occur if the antenna were at three meters from the leak. The microprocessor will store data when the 15.734 Khz signal is detected. The signal will be stored but it may not be valid.

The microprocessor also calculates the Valid Signal Detect level. The Valid Signal detect level is true when: there is 4 to 6 dB difference between the peak and average signal levels (indicating sync is present), the 15.734 Khz sync level is true; then the computer switches the FM Receiver up 4.5 MHz. After the 4.5 MHz switch, it again stores the peak, average signal levels, and the 15.734 Khz. The peak and average signal levels should now be the same level and the 15.734 Khz should no longer be present. If all of the above is true, the Valid Signal Detect Level will be true.

A GPS Receiver is used to keep track of the location of the vehicle when leaks were detected. The GPS Receiver is also used to prove that the vehicle covered the assigned route.

The deluxe control head contains the front panel switches and displays—including the above mentioned Light Emitting Diode (LED) meter. The LED meter is a logarithmic meter. The meter displays a bar graph of the signal level and has the capability to hold the peak RF level.

This capability gives the instrument the ability to see both the sync and the video signals simultaneously, thus, identifying the signal as television video. Also, this capability gives the instrument the ability to identify standing waves on the cable sheath. The leak will occur at the maximum signal level observed by the operator as he drives along the cable. This gives the operator the ability to exactly locate the discontinuity in the coax cable system. The LED meter also has its scale in color coded LED's for ease of observation. Each LED has a range of ½ to two dB which gives the meter a total dynamic range of 20 to 80 dB. Up to 20 $\mu$V/m the scale is green, from 21 $\mu$V/m to 50 $\mu$V/m the scale is yellow, and over 50 $\mu$V/m the scale is red. All of the leaks occurring in the yellow and red scale should be fixed in order for the CATV system to be in compliance with the FCC's signal leakage rules.

The fast ballistics of this meter allow the instrument to locate a leak and display the peak reading, at any vehicle speed conventional mechanical meters do not have the meter ballistics to indicate and hold peak levels, and do not have the ability to display both peak reading by a "flying dot", and average reading by a bar graph.

The antenna and electronics for the preferred embodiment of the invention have the capability to detect whether the leak is occurring on the left or right side of the vehicle. The direction is displayed with left and right indicator LED's. Additionally, the antenna has an electronic gain control to allow the LED meter to indicate properly with different ranges to the leaking cable. The electronic gain control can add or subtract 20 dB of gain from the system corresponding to ±100 feet of effective range. The electronic gain control can also be used to increase the sensitivity to leaks when all of the higher level leaks have been repaired.

An alpha numeric key pad can be interfaced with the microprocessor and additional data can be input and stored in the microprocessor's RAM. Additional information concerning a RF leak can be input thru the keypad. Cause of leak, resolution code of leak, materials used to fix leak, and time, date, and name of repair technician can be input for future reference.

In a typical cable system the more expensive embodiment described above would be in a relatively few vehicles. A less expensive embodiment would have the speedometer cable interface to the microprocessor and record only RF leaks with the 15,743 Hz sync component of the video. It will also record the miles covered by the vehicle. With the number of leaks, peak RF levels of the leak, and miles driven a "Vehicular Leakage Index" (VLI) can be computed. This number when compared with itself over a period of time will provide an indication of RF integrity. Leak index is a measurement of RF signal leakage over time. If the Leak Index is increasing over this specific time period as compared to another time period, then the number and/or level of leaks/mile is increasing. When the leaks are recorded on a separate computer and data base, the total number of leaks and their RF level, miles driven compared to total system miles, the FCC method of calculating a CLI can be used and reported to the FCC. The above embodiment could use a less expensive antenna and electronics.

Another embodiment of the invention would use the above system with a GPS or Loran Receiver. The specific location of the leaks can be recorded. With location data, the service personnel can be dispatched.

This system can also be used to detect scrambled signals without any loss of sensitivity. A scrambled signal has its vertical and/or horizontal sync pulse suppressed 6– 10 dB. This is done to prevent unauthorized use of the television signal.

Before explaining the disclosed embodiment of the present invention in detail, it is to be understood that the invention is not limited in its application to the details of the particular arrangement shown, since the invention is capable of other embodiments. Also, the terminology used herein is for the purpose of description and not of limitation.

DESCRIPTION OF PREFERRED EMBODIMENTS

Figure 1:
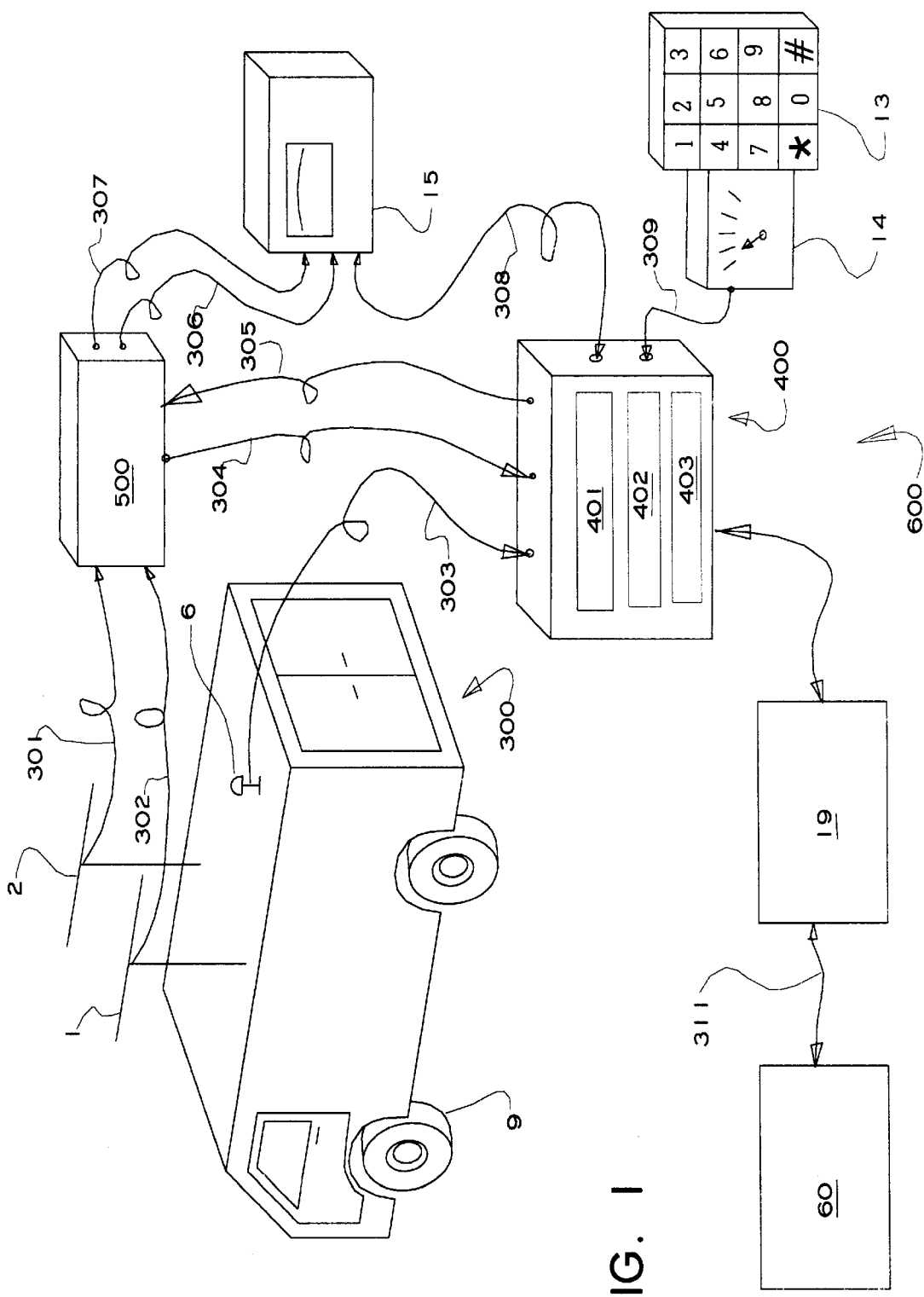
FIG. 1 is a general block diagram of the preferred embodiment of the invention.

Referring to FIG. 1 a simple block diagram for the preferred embodiment is shown. The preferred embodiment is an RF Leakage Detector (600) to be mounted in a vehicle (300). The vehicle (300) can drive at any speed and detect RF leaks from a coaxial cple system (not shown) or any other signal sources. The components of the RF Leakage Detector (600) are: the antenna system consisting of antennas (1, 2, and 6), the antenna switch box (500), the Deluxe Control Head (15), the keypad (13) and variable timer (14), the control unit (400) and the two-way radio adapter (19). The above assemblies are interconnected by cables (301 to 311). The Left Antenna (1) and Right Antenna (2) are used in conjunction with the antenna switch box (500) to detect an RF leak and the direction to the place in the coaxial cable (not shown) where the leak is occurring. The Deluxe Control Head (15) is used to display data and to input commands to the RF Leakage Detector (600). The keypad (13) is also used to input information to the RF Leakage Detector (600). The Control Unit (400) is equipped with a receiver (401) to detect the leaks, a GPS receiver (403) to obtain accurate position data, and a microprocessor (402) to control the RP Leakage Detector (600) and store the data. The vehicle (300) has a sensor (not shown) on a wheel (9) which can be used by the RF Leakage Detector (600) to obtain speed and mileage information. The variable timer (14) can direct the RF Leakage Detector to store data at regular intervals. The radio adapter (19) is an interface to a two-way radio (60) in order to receive commands from and send data to a home base (not shown).

Figure 2:
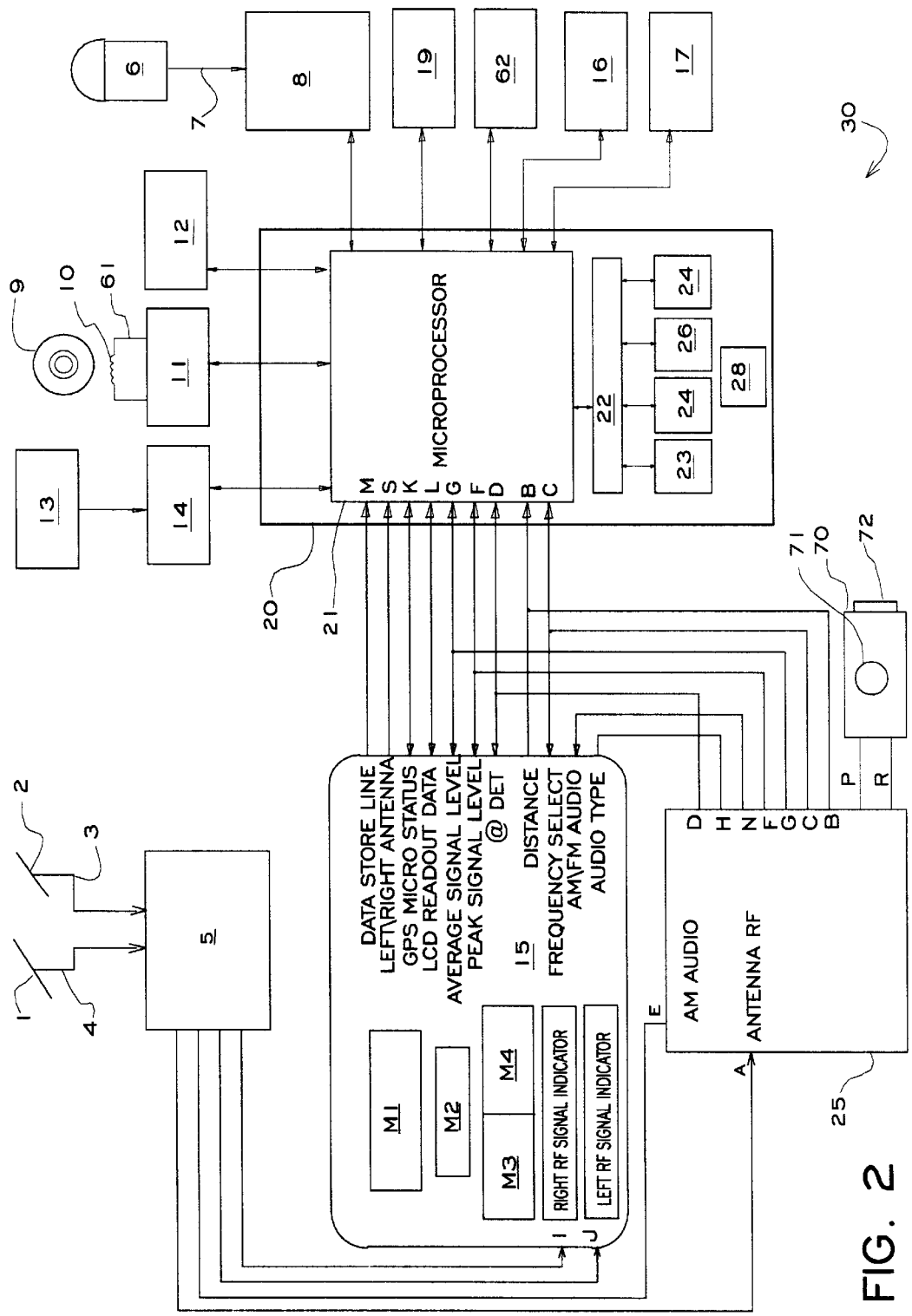
FIG. 2 is a more detailed block diagram of preferred embodiments of the invention illustrating the interconnecting signals.

FIG. 2 is the functional block diagram of the Coaxial Cable RF Leakage Detector (30).

The most important components of the Coaxial Cable RF Leakage Detector (30) are the controller box (20), the Receiver (25), and the Deluxe Control Head (15). Several external devices have inputs to, or outputs from, these three components.

The controller box (20) provides a great deal of flexibility in the use and display of data from external devices. The preferred embodiment will contain inputs from, or outputs to, all of the following external devices; however, other embodiments can be made up of any combination of the following and other external devices.

The antenna system (1–5) has the capability to receive RF energy from the left antenna (1) or the right antenna (2). The antennas (1, 2) transmit the energy over coaxial cables (3, 4) to the right/left antenna switch (5). The Receiver (25) controls the right/left antenna switch (5). The output from the right/left antenna switch (5) antenna RF (A) goes to the Receiver (25).

The GPS antenna (6) is mounted with the left and right antennas (1, 2) and is connected to the GPS Receiver (8) via coaxial cable (7). The GPS Receiver provides position data to the controller box (20). The function of the GPS Receiver and antenna (6–8) can also be performed by a Loran Receiver and antenna (not shown).

The speed of the vehicle is sensed by a speedometer sensor (10) and cable (61) on the wheel (9) of the vehicle (not shown). A vehicle speedometer interface (11) to the speedometer cable (61) provides vehicle speed data to the controller box (20).

A keypad (13) is provided to input user data to the controller box (20). Additional information concerning an RF leak can be input through the keypad such as: cause of the leak; resolution code of the leak; materials used to fix leak; time; date; and name of repair technician.

A two-way radio adaptor (19) is provided to remotely control the Coaxial Cable Leakage Detector (30) via the controller box (20). The controller box (20) can both receive commands and send data via the two-way radio interface (19). The combination of the controller box (20), the two radio adaptor (19), and a two way radio (not shown) forms a telemetry system for real time or delayed transmission of data to and from the coxial cable RF leakage detector (30).

The controller box (20) can also send and receive data via the data port (16), the auxiliary data port (17), the map display screen (62), and other interface adapters (12).

The Coaxial Cable RF Leakage Detector (30) has a Variable Timer Control (14) functioning to command the controller box (20) to store data at specific time points such as a 5 second, 30 second, 1 minute, or 1 hour schedule. The Variable Timer Control (14) is used to keep a record of the vehicle (not shown) location.

The Deluxe Control Read (15) is used for display and command functions between the Deluxe Control Head (15), the controller box (20), and the Receiver (25). The deluxe control head (15) sends the DATA STORE (M) signal to the controller box (20) and receives the LCD READOUT DATA (L) and the GPS MICROPROCESSOR STATUS (K) from the controller box (20). The deluxe control head sends three signals to the Receiver (25): the DISTANCE TO CABLE (B), the PLL FREQUENCY SELECT (C) and the AUDIO TYPE (N). The Receiver (25) then sends the DISTANCE TO CABLE (B) and the PLL FREQUENCY SELECT (C) signals on to the controller box (20). The Receiver (25) generates the @DET (where the @ in front of a signal name indicates a negative true logic signal) (D), the PEAK SIGNAL LEVEL (F) and the AVG SIGNAL LEVEL (G) and sends them to both the controller box (20) and the Deluxe Control Head (15). Three signals are generated in the Receiver (25) and sent to the Deluxe Control Head (15): s the AM/FM AUDIO (H), the RIGHT INDICATOR (I), and the LEFT INDICATOR (J).

Another feature of the VLI Receiver 30 FIG. 2 is that it can detect leaks in the reverse system of a broad band coaxial cable system. This can be done by the radio dispatcher querying the subscriber data terminals and setting the frequencies of the leakage detector (30) through the two way radio adaptor (19) on a fixed schedule. The VLI receiver can detect the reverse RF path frequencies along with a time, date and GPS location stamp for later analysis.

An optional simple control head (70) can be used in place of Deluxe Control Head (15). The simple control head is driven by the audio alarm signal (P) and the LED alarm signal (R) to light alarm light (71) and audio alarm (72).

A minimal system would include the simple control head (70) the VLI receiver (25) and an antenna (1). Internal to the controller box (20) are the microprocessor (21), the bus (22) and memory devices such as a flash RAM (23), RAM (24), ROM (26) and other storage devices (27). Also included in the controller box (20) is a power supply (28) for generating the appropriate electronics power from the vehicle battery (not shown).

Figure 3:
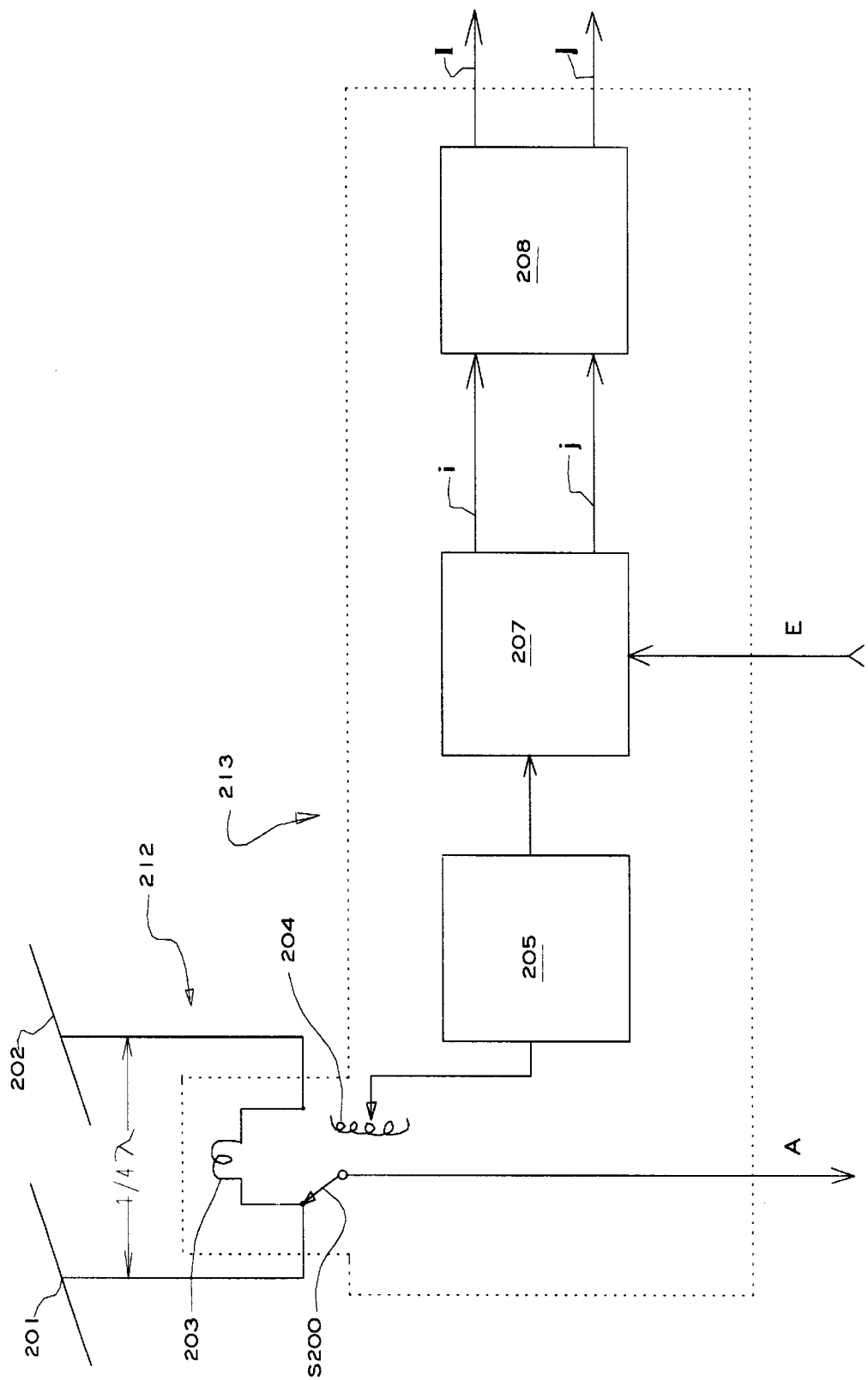
FIG. 3 is a block diagram of the antenna electronics.

The function block diagram of the antenna (212) and antenna electronics (213) is shown in FIG. 3. Two antenna elements (201 and 202) are separated by a distance of ¼ of the wave length of the signal of interest. A phasing line (203) is positioned between the two antenna elements (201 and 202). A relay (S200) is positioned such that it can switch to either side of the phasing line (203). A square wave clock (205) drives the relay coil (204) switching the relay switch (S200) back and forth between the two sides of the ¼ wave phasing line (203). If a signal is coming from the left and the relay (S200) is switched to antenna element (201), then the signal will go through the antenna element (201) to relay (S200) (i.e. 0° phase angle). The signal will be delayed ¼ wavelength (90° phase angle) at antenna element (202) due to the physical separation of the two antenna elements (201, 202) and another ¼ wavelength (90° phase angle) due to the phasing line (203) to arrive at the relay with ½ wavelength delay (180°) thus the two signals from the two antenna elements (201, 202) will cancel.

If in the same situation the relay (S200) is switched to antenna element (202), then the signal from antenna element (201) will be delayed by ¼ wavelength (90°) at the relay (S200) due to the phasing line (203). The signal from antenna element (202) will be delayed ¼ wavelength (90°) due to the physical separation of the two antenna elements (201, 202). Therefore, the two signals will add at the relay (S200) if they come from the proper direction and cancel if they come from the other direction. The RF signal (A) from Relay (S200) goes to the Receiver (25) of FIG. 2.

The AM audio (E) from the Receiver (25) goes to the L/R amplifier (207).

The L/R Amplifier (20,7) uses the left/right direction signal from the square wave clock (205) with the AM audio signal (E) from the receiver (25) to derive a right (I) and left (J) signal proportional to the signal strength of the RD energy from the two directions. The Indicator LED Driver (208) uses comparators to generate the Right (I) and Left (J) signals to drive the LED light bars (M5 and M6) or the front panel (15) of FIG. 5.

Figure 4:
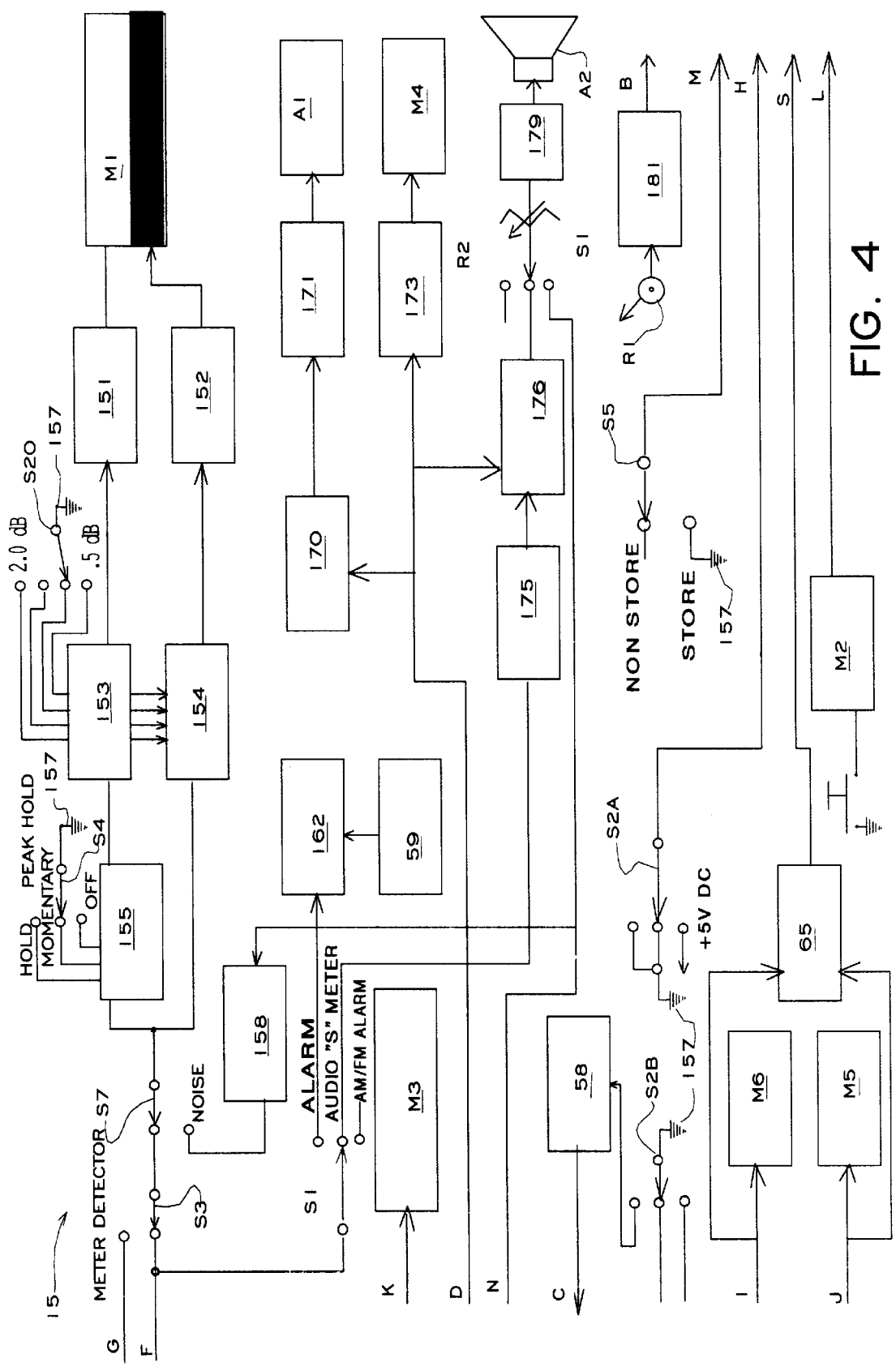
FIG. 4 is a block diagram of the Deluxe Control Head.
Figure 5:
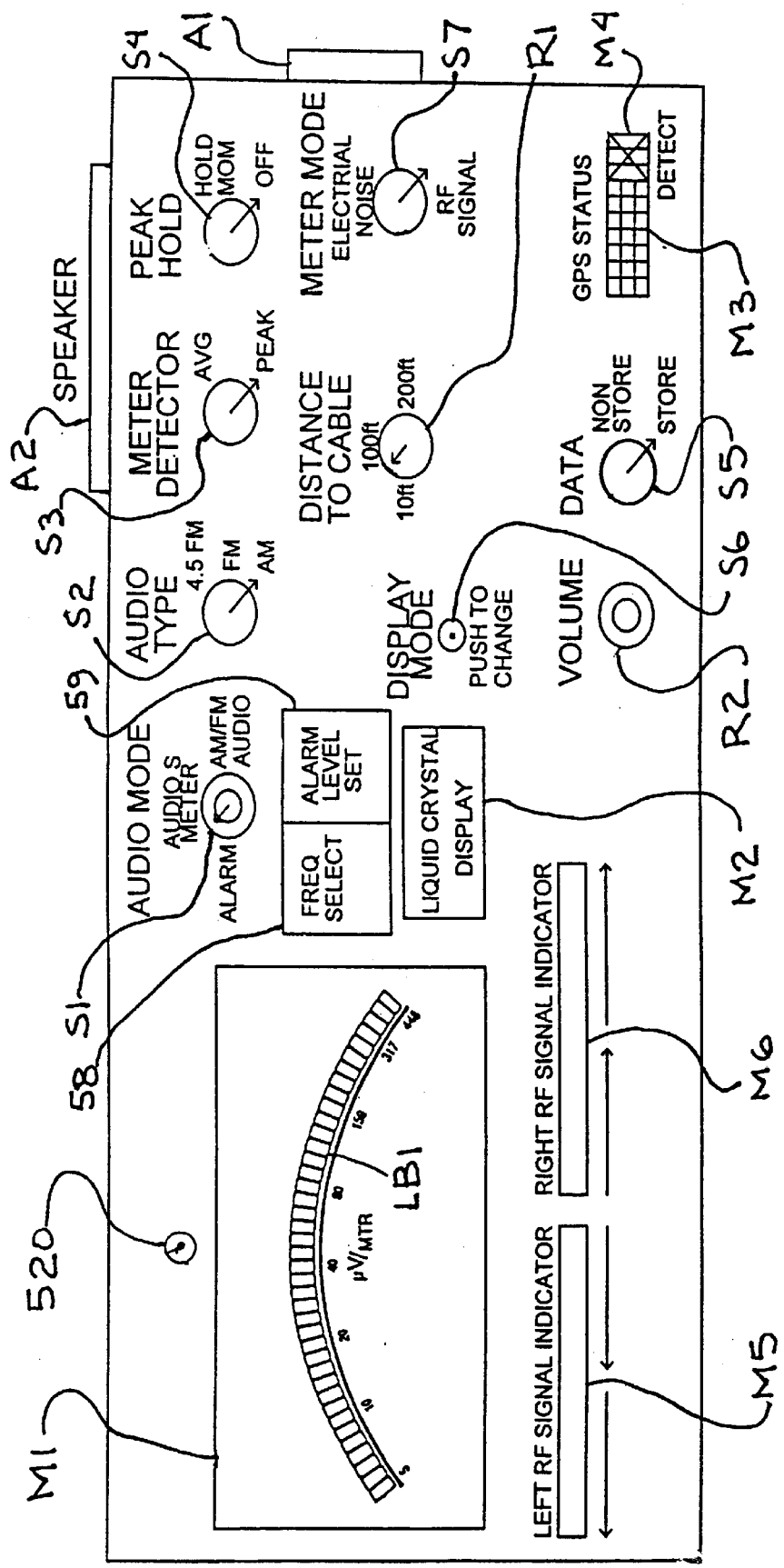
FIG. 5 is an illustration of the front panel of the Deluxe Control Head.

FIG. 4 is the functional block diagram of the Deluxe Control Head (15). FIG. 5 is a layout of the front panel of the Deluxe Control Head (15). For the following discussion of FIGS. 4, 5 a device with a letter and number in the designation appears in both figures (i.e. the device is on the front panel of the Deluxe Control Head (15).

Referring next to FIGS.: 2, 4, and 5 the double pole double throw AUDIO TYPE Switch (S2) comprising switches S2A and S2B. S2A selects a ground (157), or +5 Volts dc (156) to generate the AUDIO TYPE (H) signal to the Receiver (25). The AUDIO TYPE (H) signal will request the Receiver (25) to send FM audio on the AM/FM AUDIO (N) signal if the AUDIO TYPE (H) signal is a ground (157). If the AUDIO TYPE (H) signal is +5 Volts (156), the AM/FM AUDIO (N) signal will be AM. If switch S2B provides a ground to the frequency select switch (58) then the Receiver (25) will move up 4.5 MHz from the tuned channel to get the television audio and place it on the AM/FM AUDIO (N) signal.

The AM/FM AUDIO (N) signal from the Receiver (25) goes through the AUDIO MODE Switch (S1), a volume control (R2), and an audio amplifier (179) to speaker (A2). As previously discussed, when the AUDIO MODE Switch (S1) is in the AM/FM AUDIO position, the user will hear the audio selected by the AUDIO TYPE (S2) switch on speaker (A2). If the Audio Type (S2) switch is on 4.5 MHz FM the user will hear the audio of the tuned television channel. If the AUDIO TYPE (S2) is on FM the user will hear the output of the FM section of the Receiver (25). If the AUDIO TYPE (S2) switch is on AM the user will hear the 59.94 Hz "vertical sync buzz" of the tuned television channel or the sound of an AM carrier if the AM section of the Receiver (25) is tuned to an AM carrier.

The Average Signal Level (G) and the Peak Signal Level (F), from the Receiver (25) go to the METER MODE (S3) and the AUDIO MODE (S1) switches.

If the AUDIO MODE (S1) switch is in position "AUDIO S METER", the Audio "S" Meter Driver (175) will generate a tone with an amplitude proportional to the Peak Signal Level (F). If the Horizontal Sync Detect (D) signal from the Receiver (25) is true, then the "AND" gate (176) will allow the Audio "S" Meter tone to go through the double pole triple throw AUDIO MODE (S1) switch to the speaker (A2).

The AUDIO MODE (S1) switch has one more setting "ALARM". If the AUDIO MODE (S1) switch is set to "ALARM", the Peak Signal Level (F) will go to the Signal Alarm Level Detector (162). The Signal Alarm Level Detector (162) is set by the Alarm Level Set (S9) Thumb Wheel Switch. If the Peak Signal Level (F) exceeds the alarm level and the Horizontal Sync Detect (D) signal is true, then the "AND" gate (170) will then signal Alarm Driver Amplifier (171) to drive the AUDIO ALARM (A1). The sound of the AUDIO ALARM (A1) will notify the operator that a valid leak exceeding the alarm level has occurred.

If the @DET Signal (D) is true Driver (173) will light the Detect (M4) Light Emitting Diode.

If the METER MODE (S7) switch is in the "RF" position, then the METER DETECTOR (S3) switch can pass on the Average Signal Level (G) or the Peak Signal Level (F) signals from the Receiver (25) to the Light Emitting Diode Display Meter (M1).

The output of switches (S3 and S7) go to the Light Emitting Diode Display meter through two paths. One, the signal goes to the Peak Detector Hold Circuit (155) controlled by the Peak Hold Switch (S4). Depending on the setting of the Peak Hold Switch (S4), the Peak Detector Hold Circuit (155) will hold the highest peak signal that has occurred ("HOLD"), hold the highest peak signal that has occurred in the last few seconds ("MOMENTARY"), or pass the signal on unchanged ("OFF").

From the Peak Detector Hold Circuit (155) the signal goes through a log amplifier (153) and the Peak Signal Dot Driver (151) to display the Peak of the incoming signal on the Light Emitting Diode Display Meter (M1). The second path takes the signal through another Log Amplifier (154) and Bar Signal Dot Driver (152) to display the average of the incoming signal simultaneously with the peak value of the incoming signal on the Light Emitting Diode Display Meter (M1). The Light Emitting Diode Display Meter (M1) has a series of LED's in a line (to form a light bar (LB1).

The LED meter (M1) has its scale in forty color coded LED's for ease of observation. Each LED has a range of one half dB, one dB, one and one half dB or two dB which gives the meter a total dynamic range of 20 dB to 80 dB. The dynamic range of meter (M1) is set by switch (S20). Switch (S20) provides a ground (157) to log amplifiers (153, 154) to achieve the required gain change. Up to 20 $\mu$V/m the scale is green, from 21 $\mu$V/m to 50 $\mu$V/m the scale is yellow, and over 50 $\mu$V/m the scale is red. All of the leaks occurring in the yellow and red scale should be fixed in order for the CATV system to be in compliance with the FCC's signal leakage rules.

The fast ballistics of this LED meter (M1) allow the instrument to locate a leak and display the peak reading, at any vehicle speed. Conventional mechanical meters do not have the meter ballistics to indicate and hold peak levels, and do not have the ability to display simultaneously peak reading by a "flying dot", and average reading by a bar graph.

In the event of a leak that is a TV signal the 15.734 K Hz sync signal will be 3 dB to 6 dB above the average video as can be seen on the Light Emitting Display Meter (M1). If the TV signal is a suppressed sync signal such as a scrambled signal then the peak level should be the same as the normal TV leak at the same distance but the average level will higher by 2 dB to 4 dB.

The Frequency Select Switch (S8) is used to select the frequency of the suspected leak. The Frequency Select Switch (S8) generates the Frequency Select Signal (C) to the Receiver (25). If the leak is a television channel, then the Average Signal Level (G) is a television composite video signal. If the composite video is selected, by the switches (S3 and S7), and the Peak Detector Hold Circuit (155) is in the momentary state, then the sync signal will show on the Light Emitting Diode Display Meter (M1) as a peak and the video will be displayed 3 dB to 6 dB lower than the sync signal. The ability to see both the peak and average signals simultaneously on the light Emitting Diode Display Meter (M1) enables the operator to distinguish several types of leaks from spurious noise. Composite video is described above, a suppressed carrier or scrambled video will be similar to composite video but will have a smaller difference between sync and video, a carrier will have no difference. The Meter Mode Switch (S7) can also send the AM/FM Audio Signal (N) to the Light Emitting Diode Meter (M1). The Amplifier (158) buffers the AM/FM Audio Signal (N) for this purpose. The signal on the AM/FM audio signal (N) may be spurious noise, if so the level will be visible on the Light Emitting Diode Display Meter (M1) and heard on speaker (A2).

The distance from the vehicle to the cable can be set by the Distance to Cable Knob (R1) on the front panel (15). The Distance to Cable Knob (R1) controls the Variable Distance Emulation Switch (181) which generate the Distance (B) signal to the Receiver (25) and Controller box (20).

The GPS Status (K) signal from the controller box (20) drives the GPS Status Light Emitting Diode Display (M3). The GPS status (K) signal will indicate: GPS power OK, GPS data stream, GPS searching, GPS lock, microprocessor memory full, or GPS error.

The Front Panel (15) has a Right and Left RF Signal Indicator (MS and M6) which are driven by the Right (I) and Left (J) signals from the Receiver (25). The Right (I) and Left (J) signals also drive the Right/Left antenna indicator switch (6S) which generates the Left/Right antenna signal (S) to the controller box (20).

The user can signal the controller box (20) to store data by operating the Data Store (S5) switch. The Data Store Line (M) will be true when the Data Store (S5) switch connects it to ground (157). The controller box (20) can send data to the Liquid Crystal Display (M2) and receive information from the Display Mode (S6) momentary switch over the LCD Data (L) signal. When the Display Mode (S6) switch is pressed, the Liquid Crystal Display (M2) changes functions. The displayed data is: miles that the vehicle has been driven, number of leaks detected, peak leak detected, and Vehicle Leakage Indicator. Other data can also be displayed on the Liquid Crystal Display (M2) such as common GPS functions like distance to waypoint, ground speed, etc. Messages from a dispatcher over the two-way radio adapter (19) could also be displayed on Liquid Crystal Display (M2).

Figure 6:
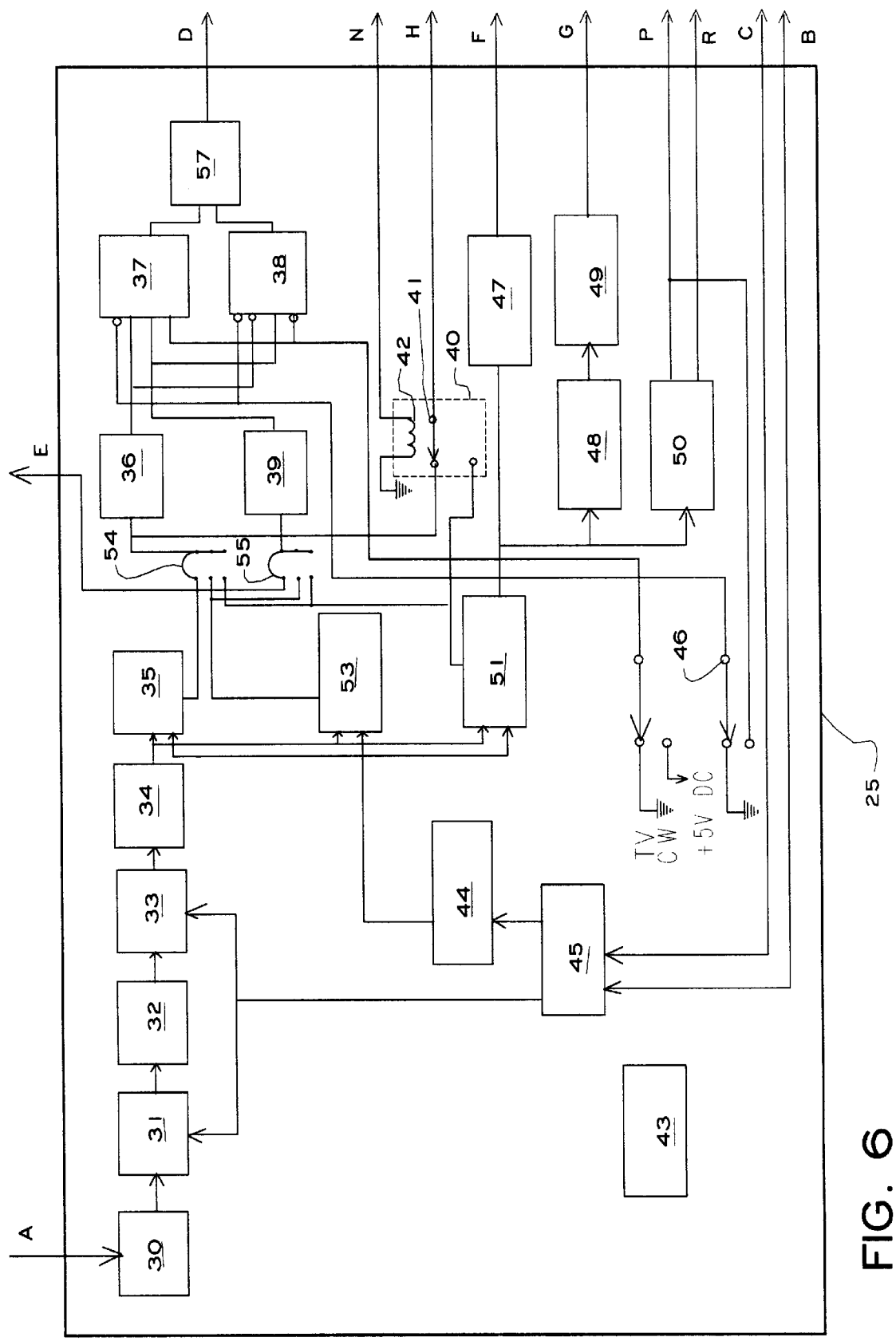
FIG. 6 is a block diagram of the VLI Receiver.
Figure 7:
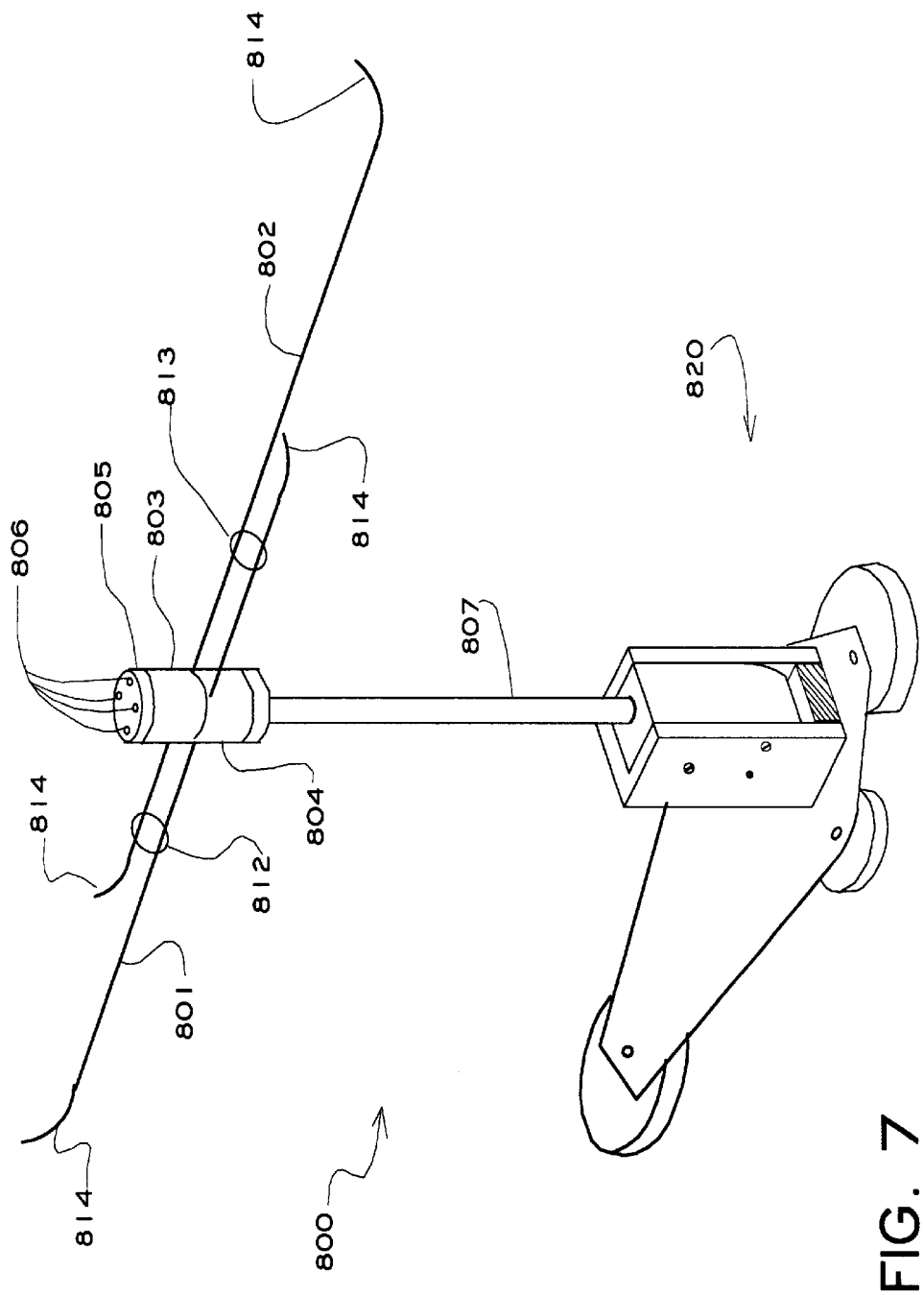
FIG. 7 is an isometric view of the antenna.
Figure 8:
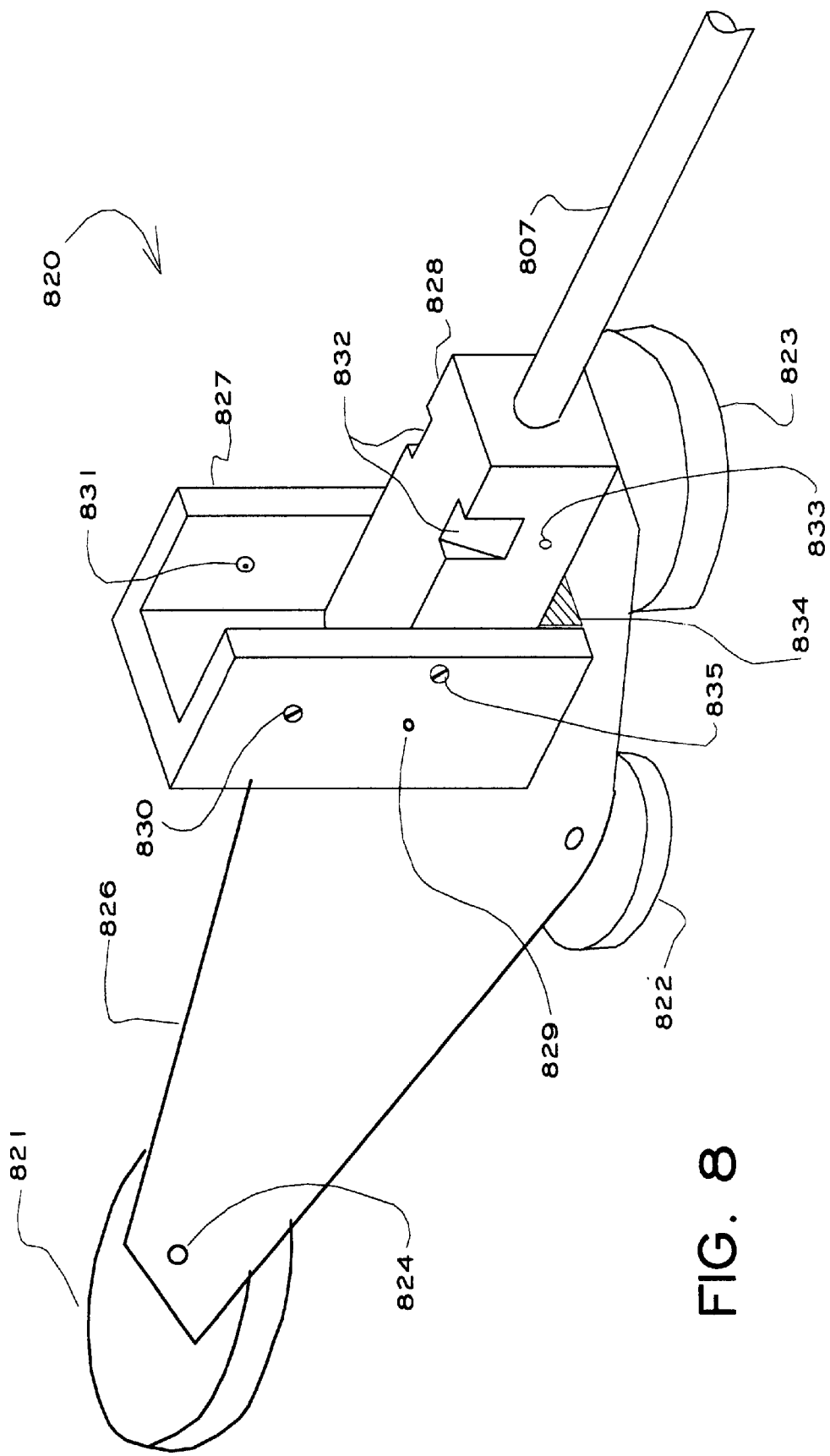
FIG. 8 is an isometric view of the antenna base with the antenna in the down position.
Figure 9:
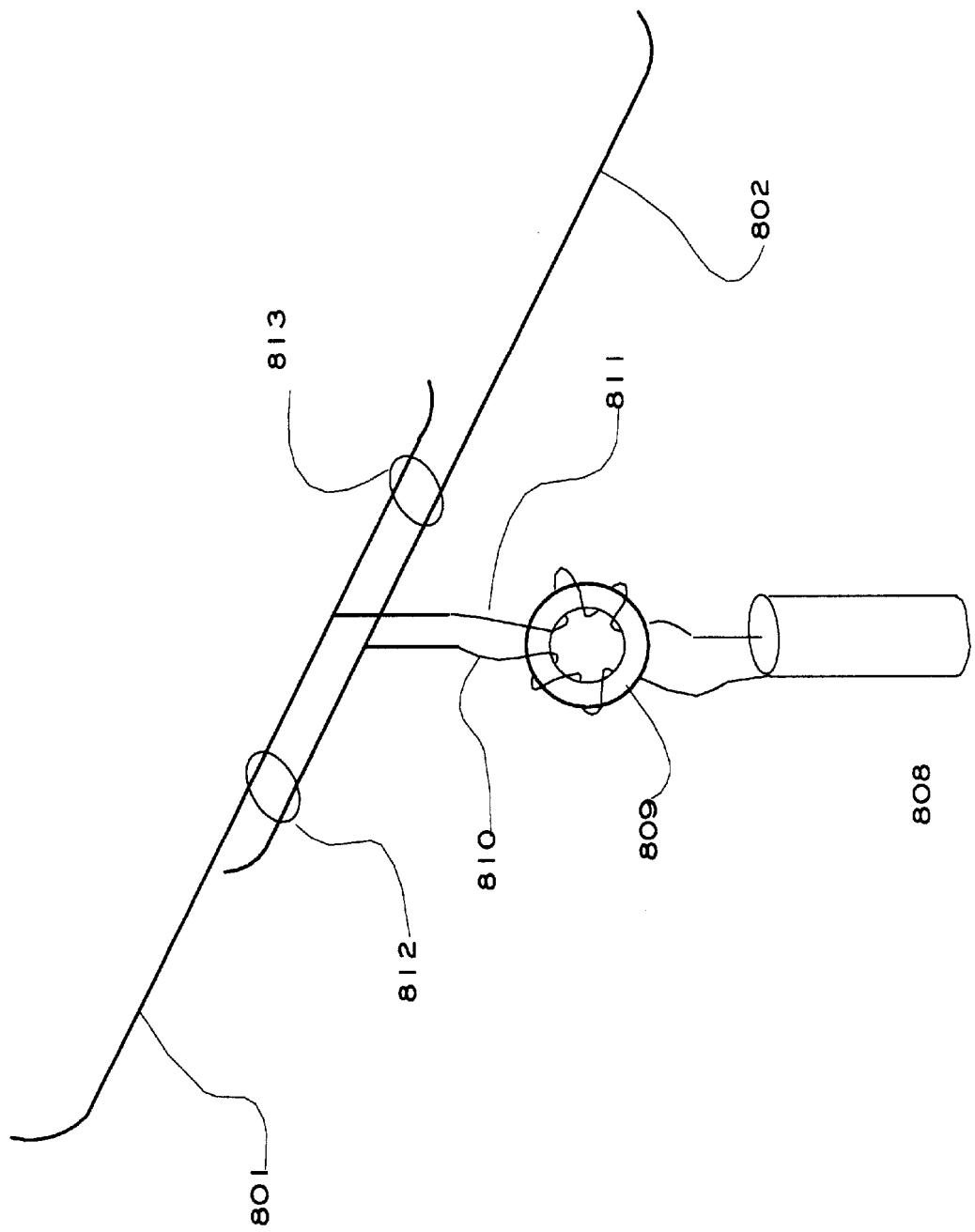
FIG. 9 is an isometric schematic view of the antenna.
Figure 10:
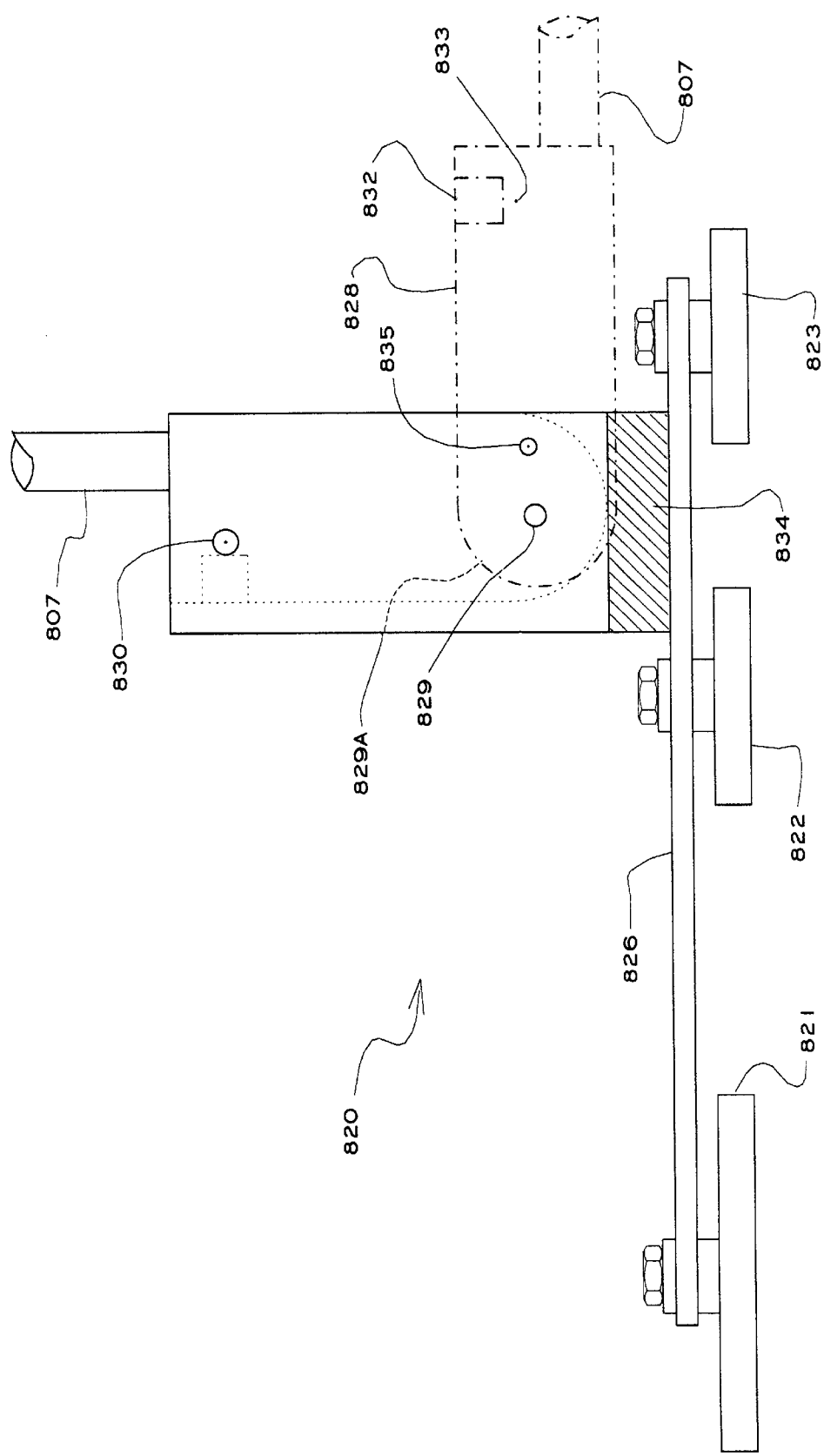
FIG. 10 is a side plane view of the antenna base in the up position with a cutaway view of the antenna in the down position.

Referring next to FIG. 6, the block diagram of the VLI receiver (25) is shown. The power supply (43) provides the necessary DC voltage for the electronics from the vehicle battery (not shown). The antenna RF (A) signal from the antenna goes through a bandpass filter (30) in series with two gain (32,34) and two attenuation stages (32,33) to the AM/FM and FSK receivers (35,51 and 53). The amount of attenuation in the attenuation stages (31,33) is controlled by a "Look Up Tables" in the PROM Controlled Driver circuit (45). The PROM Driver circuit (45) also selects the frequency of the Programmable PLL Local Oscillator (44). The inputs to the "Look Up Table" are the Frequency Select (C) and Distance (B) signals from the Deluxe Control Head (15). The VLI receiver (25) can be programmed to detect a number of different types of RF leaks by the innovative use of the outputs of the AM, FM and FSK receivers (35, 51, and 53). The frequency that the AM, FM and FSK receivers (35,51, and 53) are tuned to is controlled by the Frequency Select (C) signal via the PROM Controlled Driver Circuit (45) and the Programmable PLL Local Oscillator (44). The outputs of the three receivers (35,51 and 53) can be selected by Sync jumper (54) and noise jumper (55). The output of the AM Receiver (35) is the AM audio signal (E).

The Sync detector (36) and the noise detector (39) are Phase locked loops (PLL). The PLL's can detect frequency, amplitude, and/or phase information. A Sync Detector (36) is used on the output of the Sync jumper (54) to detect the 15.734 Khz Horizontal Sync of a TV video. The frequency of the Sync Detector (36) can be changed to detect other signals. The output of the noise jumper (55) goes to the noise detector (39) which is set at 8.0 KHz for video but is also adjustable for other signal sources. The audio type (N) signal drives the coil (42) of a relay (40) to switch (41) the AM/FM audio (H) signal between the outputs of the Sync Jumper (54) or the FM Receiver (51). The output of FM Receiver (51) drives the Signal Level Alarm Set Control (50) which in turn generates the Audio Alarm (P) signal and the LED Alarm (R) signal. The Audio Alarm (P) and LED Alarm (R) signals are for the simple control head (not shown). The output of the FM Receiver (51) drives the RF Level Peak Calibration Control (47) to generate the Peak Signal Level (F) signal for the Deluxe Control Head (15). Additionally, the output of the FM Receiver (51) drives the RF Average Filter (48) in series with the RF Average Calibration Control (49) to generate the Average Signal Level (G) for the Deluxe Control Head (15). The double pole double throw Carrier Mode Switch (46) puts the VLI Receiver (25) in the CW or TV mode. The outputs of the Carrier Mode Switch (46), and the Sync Detector (36) and the Noise Detector (39) generate the @DET Signal (D) via logic gates (37, 38, and 52). The @DET Signal (D) will be true if the VLI Receiver (25) is in the TV mode (Carrier Mode Switch (46) on TV) and the Horizontal Sync is present and there is no output from the Noise Detector (39).

Next, referring to FIGS. 7, 8, 9, and 10 where the antenna assembly (800) is shown. The RF Leakage Detector (not shown) can use one or more of the Antenna Assemblies (800). The antenna assembly (800) is designed to magnetically attach to the top of a vehicle (not shown) and to allow deflection of the components of the antenna assembly (800) in response to a collision with a tree or other obstacle while in use. In a preferred embodiment of the invention the antenna assembly (800) will mount on a surface by means of four circular magnets (821, 822, 823), which are attached to a flexible base plate (826). Three of the magnets (822, 823 and one not visible in the drawing but in a symmetrical position with magnet (822), are mounted in the base plate (826) close to the mounting base of the antenna (820). The remaining magnet, magnet (821), is preferably mounted approximately 10 inches forward of the mounting base of the antenna (820). The flexible base plate (826) is preferably made of a flexible material that will follow contour to the top of the vehicle (not shown) and provide some spring effect to prevent the antenna assembly (800) from being knocked form the vehicle in the event of contract with a tree branch or other obstacle.

In a preferred embodiment of the mounting base of the antenna (920), the mounting base (920) will consists of two units: the outer housing (827) and the inner block (828). The inner block pivotally supports the antenna mast (807), which is preferably made of stainless steel. As shown on FIG. 10, an end portion of the inner block (828) will preferably include a rounded or cammed surface (829A) which can interact with a damping means (834), which in a preferred embodiment will include a section of resilient foam, rubber or the like, or mechanical damping means. In order to allow the cammed surface (829A) to cooperate with the damping means (834), the inner block (828) is preferably allowed to pivot approximately 90 degrees about a pivot pin (829) mounted through the outer housing (827) and the inner block (828). The relationship of the cammed surface (829A) and the pivot pin (829) is such that as the inner block pivots towards the position outlined in dashed lines in FIG. 10, the cammed surface extends further and further into the damping means (834), so as to dampen the movement of the inner block as it approaches the position shown in dashed lines.

The position of the inner block (828) will preferably be maintained in the vertical position (shown in solid lines in FIG. 10) by two adjustable detent pins (831). The adjustable detent pins (831) are compressed by guides (832) to snap into detents (833) on either side of the inner block (828). In other words, the detents (833) can accept the detent pins (831) in order to hold the relative position of the inner block (828) relative to the outer housing (827). In a preferred embodiment the detent pins (831) are slidably supported within the outer housing (827). A spring is used to bias the detent pins (831) to a position where they protrude into area of the outer housing (827) that accepts the inner block (828). The bias of the spring that pushes the detent pins (831) may be adjusted by means of a screw or similar adjustment (830). Additionally, the detent pins (831) will have a rounded tip which allows them to slide in and out of the detents (833) in response to a force through the inner block (828). Thus the inner block (828) may be held in a desired position when the detent pins (831) are nested within the detents (833), and the inner block (828) will move away from this position in response to a force through the inner block (828) which causes the detent pins (831) to slide out of the detents (833). The force sufficient to knock the inner block (828) out of the detents (833) is set by adjustments (830) which control the bias on the detent pins (831). The adjustments (830) may be set such that the antenna assembly (800) will not be damaged or knocked off of the vehicle (not shown) when the antenna collides with a tree.

The damping means (834) in the outer housing (827) serves to decrease the rate of travel of the stainless steel antenna mast (807). The damping means (834) also absorbs some of the shock when the inner block (828) hits the 90 degree position. The pivot pin (829) is mounted eccentric to the radius (not shown) of the bottom of the inner block (828) to provide a cam action to progressively dampen the rate of travel of the stainless steel antenna mast (807). The antenna assembly (800) is operational in the upright position for horizontally polarized signals. The antenna assembly (800) can also be operated in the horizontal position for signals that are vertically polarized. Another detent (not shown) holds the inner block (828) in the horizontal position, adjustment (835) controls the holding force of this detent (not shown).

In a preferred embodiment, two antenna rods (801, 802), each preferably being approximately thirty six inches in length, are mounted at the top of the antenna mast (807). The rods (801, 802) are separated and restrained by two plastic clamps (803, 804). The plastic clamps (803, 804) are held in place by an aluminum cap (805) and fasteners (806). The antenna rods (801, 802) are mounted approximately one inch apart in the plastic clamps (803, 804). When the vehicle is in motion, the electrical and mechanical spacing of the antenna rods (801, 802) is maintained by spacers (812, 813). The rods (801, 802) are electrically attached to wires (810, 811) through a sliding contact (not shown) within the plastic clamps (803, 804). The described slidable adjustment of the antenna rods (801, 802) allows adjustment of the total span of the antenna for optimal reception of a desired frequency. Thus, the illustrated adjustment has been set such that the electrical contact is at the 30% point on the rods (801, 602) with 70% of the length of each rod (801, 802) extended in opposite directions, allowing reception of a desired wavelength (and hence corresponding frequency). The plastic clamps (803, 804) are hermetically sealed and house a balun (809) and an F connector (not shown) to connect to a coaxial cable (808). Another F connector (not shown) is mounted on the base plate (826) at the other end of the coaxial cable (808). The base plate (826) and the four magnets (821, 822, 823) are covered with an ABS formed plastic cover to protect the parts from the environment.

In a preferred embodiment the antenna rods (801, 802) have a bend radius at the tips (814) of the rods (801, 802) pointing up. These bends have been incorporated into the rods in order to allow the rods to bend away and slide over the surface of the vehicle in the event that the rods are forced onto the mounting surface on the vehicle as the mast and inner block (828) move relative to the outer housing (827) in response to a collision with a tree, for example. It is important to note that while the preferred embodiment includes bent tips on the rods (801, 802), it is also contemplated that the ends of the rods may simply include a wheel, skid pad, or similar means that will allow the rods (801, 802) to slide over the surface of the vehicle as the rods come down over the surface of the vehicle in response to a collision.

Thus, the rate of travel of the stainless steel antenna mast (807) is slowed by the damping means (834). When the tips (814) of the antenna rods (801, 802) hit the top of the vehicle (not shown) they slide along the vehicle roof and are prevented from digging into the vehicle roof by the bend radius (8,14). Also, the rods (801, 802) will provide a progressive spring effect when first one, and then the other, rod (801, 802) contacts the roof. A further spring effect occurs by the bending of the flexible base (826). All of the above prevents damage to the antenna assembly (800) and prevents the antenna assembly (800) from being knocked off the vehicle when a tree strike occurs. The antenna rods (801, 802) with the one inch spacing and 30%/70% configuration provides a frequency range of 110 MHZ to 160 MHZ with a band width of 50 MHZ with a VSWR of less than 3 to 1 and with a gain comparable to a dipole. Director elements and reflector elements could be added to this configuration for a better front to back ratio and a higher gain.

Figure 11:
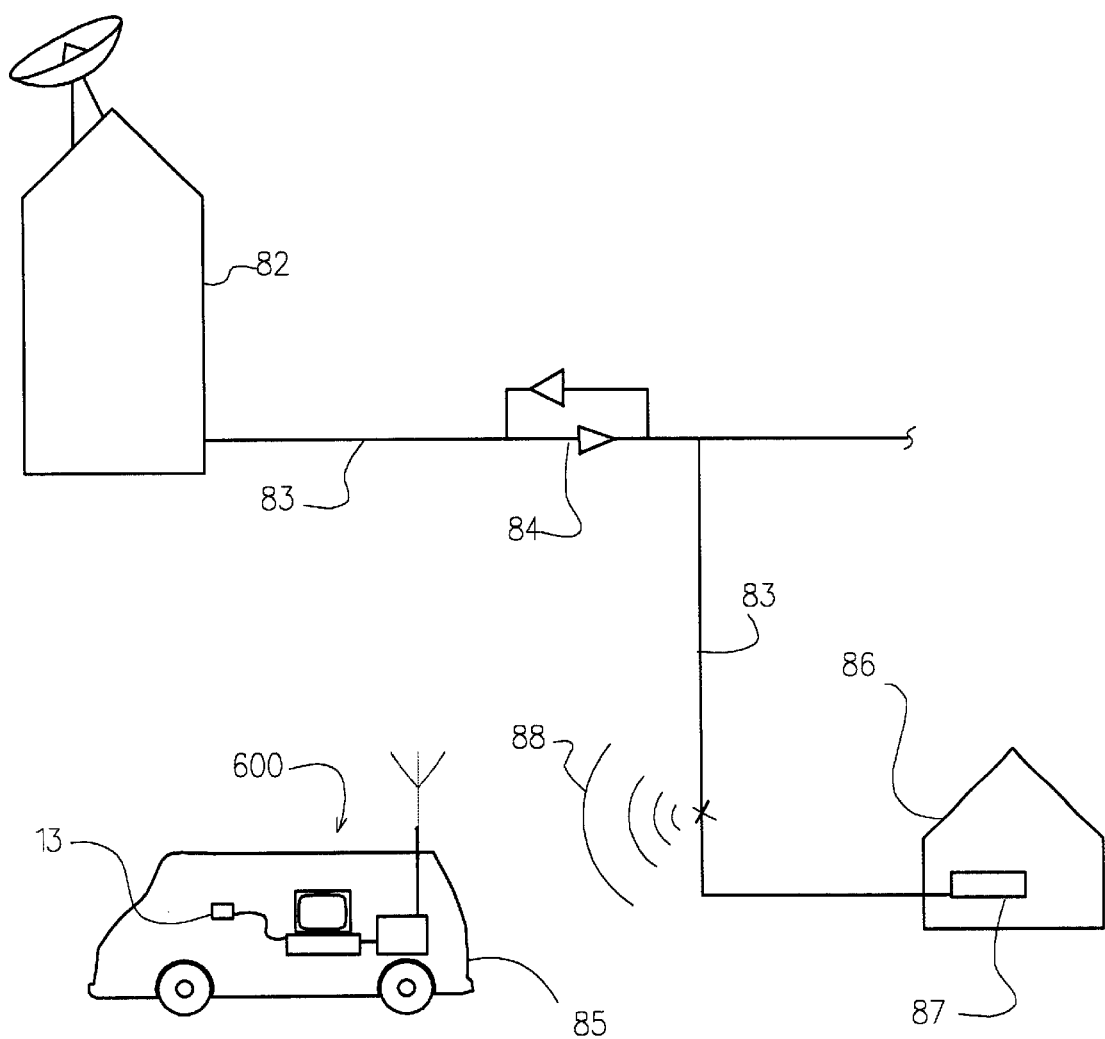
FIG. 11 shows the invention as used to detect the presence of a test signal sent by a central station to a decoder in the field. The decoder sending a signal in response to the test signal.

Referring now to FIG. 11, it will be understood that it is contemplated that the instant invention may be used to pinpoint cable leaks at a remote location. In FIG. 11 a vehicle (85) is being used to carry the apparatus for remote leak detection, or RF Leakage Detector (600) in the field. FIG. 11 shows a typical installation used for distributing radio frequency signals by cable (83). In this typical installation a signal is received by a central distribution station (82) which then distributes the signal to subscribers by means of cable with amplification stations (84) at desired intervals. A branch of the cable (83) reaches the subscriber location (86) where the signal is processed by a decoder (87) or converter. However, as illustrated, a section of the cable (83) includes a signal leak (88), perhaps caused by a damaged cable or improper cable connection or union. To pinpoint the location of the leak (88), the operator would contact the central distribution station (82) and request that a test signal (at a frequency that does not deteriorate or interfere with other signals sent to the subscriber) be sent to the subscriber's decoder (87). Once the decoder (87) receives this test signal from the central distribution station (82), the decodes (87) will emit a response signal which is of a strength and frequency that is easily detected by the RF Leakage Detector (600). Thus the operator in the truck (85) may make repeated requests to emit the test signal in order to iteratively refine the location of the leak relative to the vehicle (85).

Thus it can be appreciated that the above described embodiments are illustrative of just a few of the numerous variations of arrangements of the disclosed elements used to carry out the disclosed invention. Moreover, while the invention has been particularly shown, described and illustrated in detail with reference to preferred embodiments and modifications thereof, it should be understood that the foregoing and other modifications are exemplary only, and that equivalent changes in form and detail may be made without departing from the true spirit and scope of the invention as claimed, except as precluded by the prior art.

What is claimed is:

1. An antenna of adjustable span for receiving broadband signals, the antenna comprising:
    a base;
    a first elongated antenna rod of a length;
    a second elongated antenna rod of a length, the first elongated antenna rod being slidably attached to the second elongated antenna rod in a parallel orientation to the second elongated antenna rod, allowing the first elongated antenna rod to slide in a parallel fashion from a first position where the first elongated antenna overlaps the second elongated antenna rod a first amount to a second position where the first antenna rod overlaps the second antenna rod a second amount, the second amount of overlap being smaller than the first amount of overlap, thereby adjust the span of the antenna;
    an electrical contact connected to said first elongated antenna rod; and
    an electrical contact connected to said second elongated antenna rod, so that the antenna is tuned to a desired wavelength by adjusting the span of the antenna by selectively positioning said first elongated antenna rod next to said second elongated antenna rod.

2. An antenna of adjustable span, the adjustable span accommodating variation in bandwidth of broadband signals, the antenna comprising:
    a base;
    a mast pivotally mounted on said base;
    a first elongated antenna rod of a length;
    a second elongated antenna rod of a length;
    a support hub mounted on said mast and supporting the first elongated antenna rod next to the second elongated antenna rod in a generally parallel orientation, the first elongated antenna rod being slidably attached to the second elongated antenna rod so that the first elongated antenna rod slides in a parallel fashion from a first position where the first elongated antenna overlaps the second elongated antenna rod a first amount to a second position where the first antenna rod overlaps the second antenna rod a second amount, the second amount of overlap being smaller than the first amount of overlap, thereby adjust the span of the antenna;
    a balun, electrically connected to said first elongated antenna rod and said second elongated antenna rod, so that the antenna is tuned to a desired wavelength by selectively positioning said first elongated antenna rod next to said second elongated antenna rod.

3. A method for tuning into a desired wavelength of broadband electro magnetic signals, the method comprising providing an adjustable antenna comprising:
    a first elongated antenna rod of a length;
    a second elongated antenna rod of a length, the first elongated antenna rod being slidably attached to the second elongated antenna rod in a parallel orientation to the second elongated antenna rod, allowing the first elongated antenna rod to slide in a parallel fashion from a first position where the first elongated antenna overlaps the second elongated antenna rod a first amount to a second position where the first antenna rod overlaps the second antenna rod a sec ond amount, the second amount of overlap being smaller than the first amount of overlap, thereby adjust the span of the antenna; means for selectively securing the first elongated antenna rod next to and in a parallel orientation to the second elongated antenna rod; and selectively positioning said first elongated antenna rod next to and along said second elongated antenna rod until the reception of the desired wavelength is achieved.

\* \* \* \* \*